US008958934B2

(12) United States Patent
Nishida

(10) Patent No.: US 8,958,934 B2
(45) Date of Patent: Feb. 17, 2015

(54) BATTERY PACK AND BATTERY CONTROL SYSTEM

(75) Inventor: Takehiko Nishida, Tokyo (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 137 days.

(21) Appl. No.: 13/394,454

(22) PCT Filed: Mar. 24, 2011

(86) PCT No.: PCT/JP2011/057189
§ 371 (c)(1),
(2), (4) Date: Mar. 6, 2012

(87) PCT Pub. No.: WO2011/118711
PCT Pub. Date: Sep. 29, 2011

(65) Prior Publication Data
US 2012/0166031 A1 Jun. 28, 2012

(30) Foreign Application Priority Data
Mar. 26, 2010 (JP) ................................. 2010-072196

(51) Int. Cl.
*B60L 11/00* (2006.01)
*H02J 7/00* (2006.01)
(Continued)

(52) U.S. Cl.
CPC ........... *H02J 7/0026* (2013.01); *B60L 11/1861* (2013.01); *B60L 11/1864* (2013.01);
(Continued)

(58) Field of Classification Search
USPC ................. 701/29; 702/63; 429/61; 439/894; 180/65.2; 307/66; 318/139; 320/132, 320/151; 323/269; 324/429; 361/93.1
See application file for complete search history.

(56) References Cited

U.S. PATENT DOCUMENTS

| 5,811,890 A * | 9/1998 | Hamamoto ..................... 307/66 |
| 2002/0039270 A1* | 4/2002 | Sato ............................. 361/93.1 |

(Continued)

FOREIGN PATENT DOCUMENTS

| JP | 2001-185228 A | 7/2001 |
| JP | 2003-87901 A | 3/2003 |

(Continued)

OTHER PUBLICATIONS

International Search Report of PCT/JP2011/057189, mailing date Jun. 14, 2011.

(Continued)

*Primary Examiner* — James Trammell
*Assistant Examiner* — Sanjeev Malhotra
(74) *Attorney, Agent, or Firm* — Westerman, Hattori, Daniels & Adrian, LLP

(57) ABSTRACT

A battery pack includes: a battery unit in which a plurality of battery modules with a plurality of secondary batteries connected in series to each other is connected in parallel to each other so that output current; and a battery management unit. The battery management unit calculates a first allowable current value of each of the plurality of battery modules and calculates second allowable current values of the other battery modules based on the first allowable current value of one battery module from the plurality of battery modules. The battery management unit calculates a value corresponding to the sum of the first allowable current value used as the reference and the respective second current values as an allowable current value when each of the second allowable current values is equal to or smaller than the first allowable current value of the corresponding battery module.

4 Claims, 5 Drawing Sheets

(51) Int. Cl.
*B60L 11/18* (2006.01)
*G01R 31/36* (2006.01)

(52) U.S. Cl.
CPC ......... *Y02T10/7055* (2013.01); *G01R 31/3651* (2013.01); *B60L 2240/545* (2013.01); *B60L 2240/549* (2013.01); *Y02T 10/7044* (2013.01); *Y02T 10/7005* (2013.01); *Y02T 10/7061* (2013.01); *Y02T 10/7011* (2013.01)
USPC .................. 701/22; 701/29; 702/63; 429/61; 439/894; 180/65.2; 307/66; 318/139; 320/132; 320/151; 323/269; 324/429; 631/93.1

(56) References Cited

U.S. PATENT DOCUMENTS

| | | | | |
|---|---|---|---|---|
| 2003/0052688 | A1* | 3/2003 | Yudahira et al. | 324/429 |
| 2003/0220026 | A1* | 11/2003 | Oki et al. | 439/894 |
| 2005/0230160 | A1* | 10/2005 | Watanabe et al. | 180/65.2 |
| 2006/0139005 | A1* | 6/2006 | Niculae et al. | 320/132 |
| 2007/0205746 | A1* | 9/2007 | Iida et al. | 320/151 |
| 2007/0210769 | A1* | 9/2007 | Tsutsumi et al. | 323/269 |
| 2010/0136390 | A1* | 6/2010 | Ueda et al. | 429/61 |
| 2010/0141186 | A1* | 6/2010 | Katzenberger et al. | 318/139 |
| 2010/0185405 | A1* | 7/2010 | Aoshima et al. | 702/63 |
| 2011/0313613 | A1* | 12/2011 | Kawahara et al. | 701/29 |

FOREIGN PATENT DOCUMENTS

| | | |
|---|---|---|
| JP | 2005-94914 A | 4/2005 |
| JP | 2007-165211 A | 6/2007 |
| JP | 2007-226992 A | 9/2007 |
| JP | 3994700 B2 | 10/2007 |
| JP | 2008-312391 A | 12/2008 |
| JP | 2010-271286 A | 12/2010 |
| JP | 2010-271287 A | 12/2010 |
| JP | 2010-271288 A | 12/2010 |
| KR | 10-2007-0029936 A | 3/2007 |
| WO | 2010/007681 A1 | 1/2010 |
| WO | 2010/067724 A1 | 6/2010 |

OTHER PUBLICATIONS

Written Opinion of PCT/JP2011/057189, mailing date Jun. 14, 2011.
Japanese Office Action dated Aug. 20, 2013, issued in corresponding Japanese Patent Application No. 2010-072196, w/ English translation.
Chinese Office Action dated Sep. 10, 2013, issued in corresponding Chinese Patent Application No. 201180003222.3, w/ partial English translation.

* cited by examiner

FIG. 4

ALLOWABLE CURRENT VALUE[A]

| °C | SOC (CHARGE RATE) [%] | | | | | | | | | | |
|---|---|---|---|---|---|---|---|---|---|---|---|
| | 0 | 10 | 20 | 30 | 40 | 50 | 60 | 70 | 80 | 90 | 100 |
| -30 | ... | ... | ... | ... | ... | ... | ... | ... | ... | ... | ... |
| -20 | ... | ... | ... | ... | ... | ... | ... | ... | ... | ... | ... |
| -10 | ... | ... | ... | ... | ... | ... | ... | ... | ... | ... | ... |
| 0 | ... | ... | ... | ... | ... | ... | ... | ... | ... | ... | ... |
| 5 | ... | ... | ... | 12 | ... | ... | ... | ... | ... | ... | ... |
| 10 | ... | ... | 12 | 13 | 14 | ... | ... | ... | ... | ... | ... |
| 15 | ... | ... | 13 | 14 | 15 | ... | ... | ... | ... | ... | ... |
| 20 | ... | ... | 14 | 15 | 16 | ... | ... | ... | ... | ... | ... |
| 25 | ... | ... | ... | 16 | ... | ... | ... | ... | ... | ... | ... |
| . | ... | ... | ... | ... | ... | ... | ... | ... | ... | ... | ... |
| . | ... | ... | ... | ... | ... | ... | ... | ... | ... | ... | ... |
| . | ... | ... | ... | ... | ... | ... | ... | ... | ... | ... | ... |
| . | ... | ... | ... | ... | ... | ... | ... | ... | ... | ... | ... |

ALLOWABLE CURRENT VALUE REFERENCE TABLE

BATTERY PACK AND BATTERY CONTROL SYSTEM

TECHNICAL FIELD

The present invention relates to a battery unit which includes plurality of secondary batteries, a battery pack which includes a battery management unit used to manage the battery unit, and a battery control system which manages and controls the battery pack.

Priority is claimed on Japanese Patent Application No. 2010-072196, filed on Mar. 26, 2010, the content of which is incorporated herein by reference.

BACKGROUND ART

Hitherto, in a battery control system such as in an electric vehicle, a secondary battery such as a lithium ion battery which can be repeatedly charged and discharged has been used as a battery which supplies electrical power to the battery control system. Then, since such a battery control system demands high electrical power, a battery unit is used in which plurality of secondary batteries are connected in series to each other (hereinafter, referred to as a "battery module") and plurality of battery modules are further connected in parallel to each other.

For example, in the electric vehicle, a battery pack which includes an assembled battery (hereinafter, the assembled battery will be referred to as a "battery unit") and a battery management unit (hereinafter, the battery management unit will be referred to as a BMS) with a CMU and a BMU managing the battery unit is disposed at a predetermined position inside the vehicle, and a vehicle-side controller which serves as a high-order system control unit (hereinafter, the vehicle-side controller will be referred to as a vehicle ECU) communicates with the BMU so as to control the charging and discharging operations of the battery unit.

Furthermore, PTL 1 discloses a technique relating to the battery control system on which the battery unit is mounted. According to PTL 1, a control circuit 4 (a battery control unit 10 and a vehicle control unit 11) which serves as a high-order system and is mounted on a hybrid vehicle monitors the current at the time of charging and discharging the battery unit.

Then, when an abnormality is detected in any one of the respective battery modules constituting the battery unit, the control circuit 4 performs a control in which the battery module in which the abnormality is detected is disconnected, thereby preventing the entire battery unit from becoming unusable.

CITATION LIST

Patent Literature

[PTL 1] Japanese Unexamined Patent Application First Publication No. 2001-185228

SUMMARY OF INVENTION

Problems to be Solved by the Invention

However, as in the related art, when the vehicle-ECU unilaterally controls the output current of the battery unit, the following problems may occur.

That is, according to PTL 1, when the connection of the battery module is disconnected after the abnormality in the battery module is detected, the output reduction of the battery cannot be prevented. Furthermore, particularly, in a vehicle such as an electric vehicle or a hybrid vehicle, for example, when it is running a highway or a lane for slower traffic, it is better to avoid a rapid reduction of battery output, even if the degradation is merely small.

On the other hand, in PTL 1, a signal representing the occurrence of the abnormality in the battery module is only transmitted from the battery pack to the vehicle-ECU. However, when the vehicle-ECU which receives the signal does not perform the disconnection, a current of the battery unit exceeds the allowable current continuously, thereby the degradation of the secondary battery being accelerated or a critical failure to be occur.

Specifically, the output current is not distributed uniformly simply due to a difference in the internal resistance of the battery of each battery module, a difference in the length of the wiring connecting modules, a difference in the contact resistance of the terminal connection, and the like. Thus, the current which is required from the control circuit is not uniformly distributed in the each battery module, and when the difference in the internal resistance or the difference in the wiring resistance in the each battery module is taken into consideration, several battery modules may output current which exceeds the allowable current.

Then, when a battery module outputs a current which exceeds the allowable current, an abnormal condition may occur in that battery module. On the other hand, when the control circuit disconnects the connection of the battery module in order to prevent the occurrence of the abnormal condition, the output current from the battery unit is degraded.

Therefore, it is an object of this invention provides a battery pack capable of preventing occurrence of an abnormal condition in each battery module constituting a battery unit and hence preventing the value of a current output of each battery module from exceeding an allowable current value, and provides a battery control system managing and controlling this battery pack.

Solution to Problem

In order to attain the above-described object, according to an aspect of the invention, a battery pack includes: a battery unit, in which a plurality of battery modules constructed with a plurality of secondary batteries connected in series to each other is connected in parallel to each other, and output current; and a battery management unit that calculates an allowable current value of the current. The battery management unit includes a first allowable current value calculating unit that calculates a first allowable current value of each of the plurality of battery modules, a second allowable current value calculating unit that calculates second allowable current values of the other battery modules on the basis of a reference which is the first allowable current value of one battery module of the plurality of battery modules, a calculating unit that calculates the sum of the first allowable current value of one battery module which used as the reference, and the second current value of other battery modules as the allowable current value of the battery unit, when each of the second allowable current values are equal to or smaller than the first allowable current value of the corresponding battery module, and an allowable electric power value notifying unit that notifies the sum value calculated by the calculating unit to the outside.

Further, in order to attain the above-described object, according to another aspect of the invention, a battery control system includes: a power load; a battery unit, in which a plurality of battery modules with a plurality of secondary batteries connected in series to each other are connected in parallel to each other, and output current to the power load; a first allowable current value calculating unit that calculates a first allowable current value of each of the plurality of battery modules; a second allowable current value calculating unit that calculates second allowable current values of the other battery modules on the basis of a reference which is the first allowable current value of one battery module of the plurality of battery modules; a calculating unit that calculates the sum of the first allowable current value of one battery module which used as the reference, and the second current value of other battery modules as the allowable current value of the battery unit, when each of the second allowable current values are equal to or smaller than the first allowable current value of the corresponding battery module; and a high-order system control unit that receives the allowable current value and controls the power load so that the output current of the battery unit is equal to or smaller than the allowable current value.

Effects of Invention

According to the above-described aspect of the invention, the output current of battery module which exceeds the allowable current value is prevented. Therefore, it is possible to prevent the output reduction of the battery unit or prevent the degradation of the secondary batteries constituting the battery module.

BRIEF DESCRIPTION OF DRAWINGS

FIG. 4 is a diagram illustrating an allowable current value reference table which is stored in the BMU.

DESCRIPTION OF EMBODIMENTS

Figure 1:
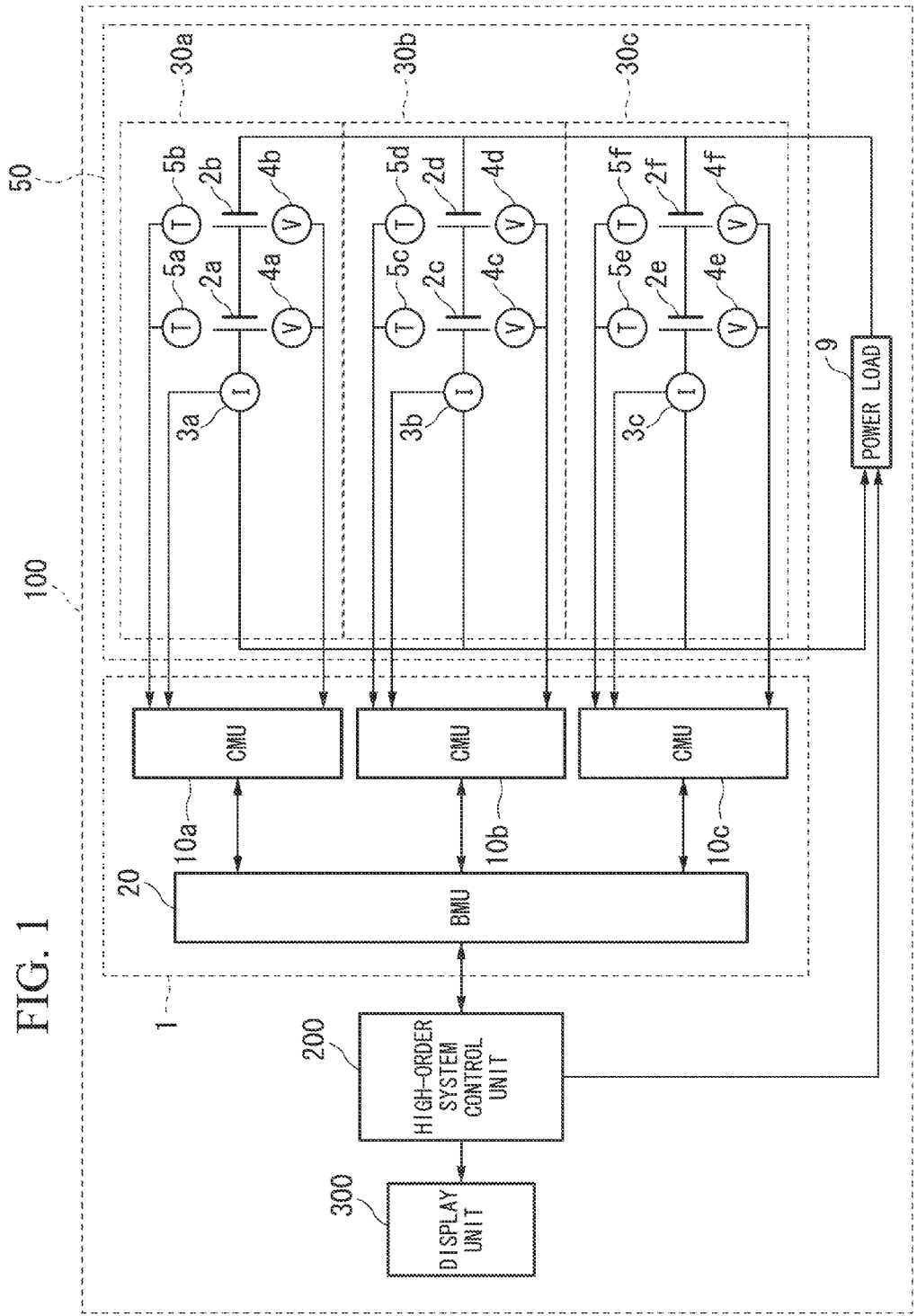
FIG. 1 is a block diagram illustrating a configuration of a battery control system.

Hereinafter, a battery pack according to an embodiment of the invention and a battery control system controlling the battery pack will be described by referring to the drawings.

FIG. 1 is a block diagram illustrating a configuration of the battery control system of the embodiment.

A battery control system 100 is, for example, an electric vehicle, and performs a control in which desired electrical power is supplied from a battery unit 50 to a power load 9 which is mounted on the battery control system 100. Furthermore, in the description below, an electric vehicle will be exemplified as the battery control system, but for example, a mobile vehicle such as an industrial vehicle like a forklift, a hybrid electric vehicle, an electric train, a ship, and an airplane may be used. Further, a stationary battery control system such as a home power supply which supplies electrical power to electrical equipment corresponding to a power load may be used. That is, as another battery control system which drives the power load by electrical power, the battery control system 100 of the invention may be used. The power load 9 is, for example, an electric motor which is connected to a vehicle wheel in the case of a mobile vehicle such as an industrial vehicle, a hybrid electric vehicle, and an electric train. On the other hand, the power load is, for example, an electric motor which is connected to a propeller in the case of a mobile vehicle such as a ship and an airplane.

The battery control system 100 may include a battery pack equipped with a battery unit 50 and a BMS (Battery Management System) 1. The BMS 1 corresponds to the battery management unit of the invention, includes the CMUs (Cell Monitor Units) 10a to 10c (hereinafter, generally referred to as the CMU 10) and a BMU (Battery Management Unit) 20, and monitors and controls the secondary battery 2.

The battery unit 50 has a configuration in which a battery module 30a with secondary batteries 2a and 2b connected in series to each other, a battery module 30b with secondary batteries 2c and 2d connected in series to each other, and a battery module 30c with secondary batteries 2e and 2f connected in series to each other are connected in parallel to each other.

In the description below, the battery modules 30a, 30b, and 30c are generally referred to as the battery module 30. Further, the secondary batteries 2a to 2f are generally referred to as the secondary battery 2. In the same way, the same applies to the constituents which are denoted by the reference signs with numerals and characters a to f in FIG. 1, and the constituents may be described generally by the numerals alone.

Further, the battery control system 100 includes: at least the power load 9 which consumes electrical power output from the battery unit 50 or charges the battery unit 50; a high-order system control unit 200 which controls the charging and discharging operation of the battery unit 50 by communication with the BMU 20; and a display unit 300 which displays any one of information items calculated by the high-order system control unit 200.

In the embodiment, each battery module 30 constituting the battery unit 50 includes: two secondary batteries 2 which are connected in series to each other; an ammeter 3 which measures charging and discharging current of the battery module 30; two voltmeters 4 which measure the voltage values between anode and cathode of each secondary battery 2; and two thermometers 5 which measure the temperature of the casing of each secondary battery 2.

Then, the CMUs 10a to 10c inside the BMS 1 respectively correspond one to one to the plural battery modules 30a to 30c which include plural secondary batteries 2 connected in series to each other. Furthermore, the CMU 10 is not limited to the example in which the CMUs correspond to one to one to the battery modules 30, and for example, the CMUs 10 may correspond one to one to the secondary batteries 2.

The CMU 10a acquires the value of charging and discharging current of the battery module 30a from the ammeter 3a which is connected thereto through a signal line. Further, the CMU acquires the voltage and the temperature of the secondary battery 2a inside the battery module 30a from the voltmeter 4a and the thermometer 5a which are connected thereto through signal lines. Furthermore, the CMU acquires the voltage and the temperature of the secondary battery 2b inside the battery module 30a from the voltmeter 4b and the thermometer 5b which are connected thereto through signal lines.

The CMU 10b acquires the value of charging and discharging current of the battery module 30b from the ammeter 3b which is connected thereto through a signal line. Further, the CMU acquires the voltage and the temperature of the secondary battery 2c inside the battery module 30b from the voltmeter 4c and the thermometer 5c which are connected thereto through signal lines. Furthermore, the CMU acquires the voltage and the temperature of the secondary battery 2d inside the battery module 30b from the voltmeter 4d and the thermometer 5d which are connected thereto through signal lines.

The CMU 10c acquires the value of charging and discharging current of the battery module 30c from the ammeter 3c which is connected thereto through a signal line. Further, the CMU acquires the voltage and the temperature of the secondary battery 2e inside the battery module 30c from the voltmeter 4e and the thermometer 5e which are connected thereto through signal lines. Furthermore, the CMU acquires the voltage and the temperature of the secondary battery 2f inside the battery module 30c from the voltmeter 4f and the thermometer 5f which are connected thereto through signal lines.

Furthermore, the ammeters 3a to 3c are generally referred to as the ammeter 3, the voltmeters 4a to 4f are generally referred to as the voltmeter 4, and the thermometers 5a to 5f are generally referred to as the thermometer 5. Furthermore, the CMU 10 and the ammeter 3 correspond to the current value acquiring unit of the invention, and the CMU 10 and the thermometer 5 correspond to the temperature value acquiring unit of the invention.

The BMU 20 shown in FIG. 1 is connected to the CMUs 10a to 10c. The BMU 20 performs a process in which charging and discharging current of each battery module 30 is limited within the range of the allowable current value on the basis of the current values and the temperature values respectively acquired from the CMUs 10a to 10c, the allowable current value (which will be described later in detail) calculated from the BMU 20, and the like.

More specifically, the BMU 20 is electrically connected to the high-order system control unit 200 which controls the electric vehicle, and notifies the information relating to the allowable current value which is allowed as the battery unit to the high-order system control unit 200.

The high-order system control unit 200 is a process unit which controls the power load 9 mounted on the electric vehicle. More specifically, the high-order system control unit 200 controls a current value which is required by the power load 9 to the battery unit 50 on the basis of the allowable current value which is notified from the BMU 20.

Accordingly, in the battery unit 50 which performs a discharging operation on the power load 9 or a charging operation from the power load 9, the value of charging and discharging current of each battery modules 30a to 30c are limited in the allowable range. In this way, the battery control system 100 performs a process in which charging and discharging current of each battery module 30 or input and output electric power of each battery module 30 is limited.

Furthermore, in the embodiment, the power load 9 is an electric motor which is mounted on the electric vehicle, and power generated by the motor is transmitted to a driving wheel, thereby driving the electric vehicle.

Figure 2:
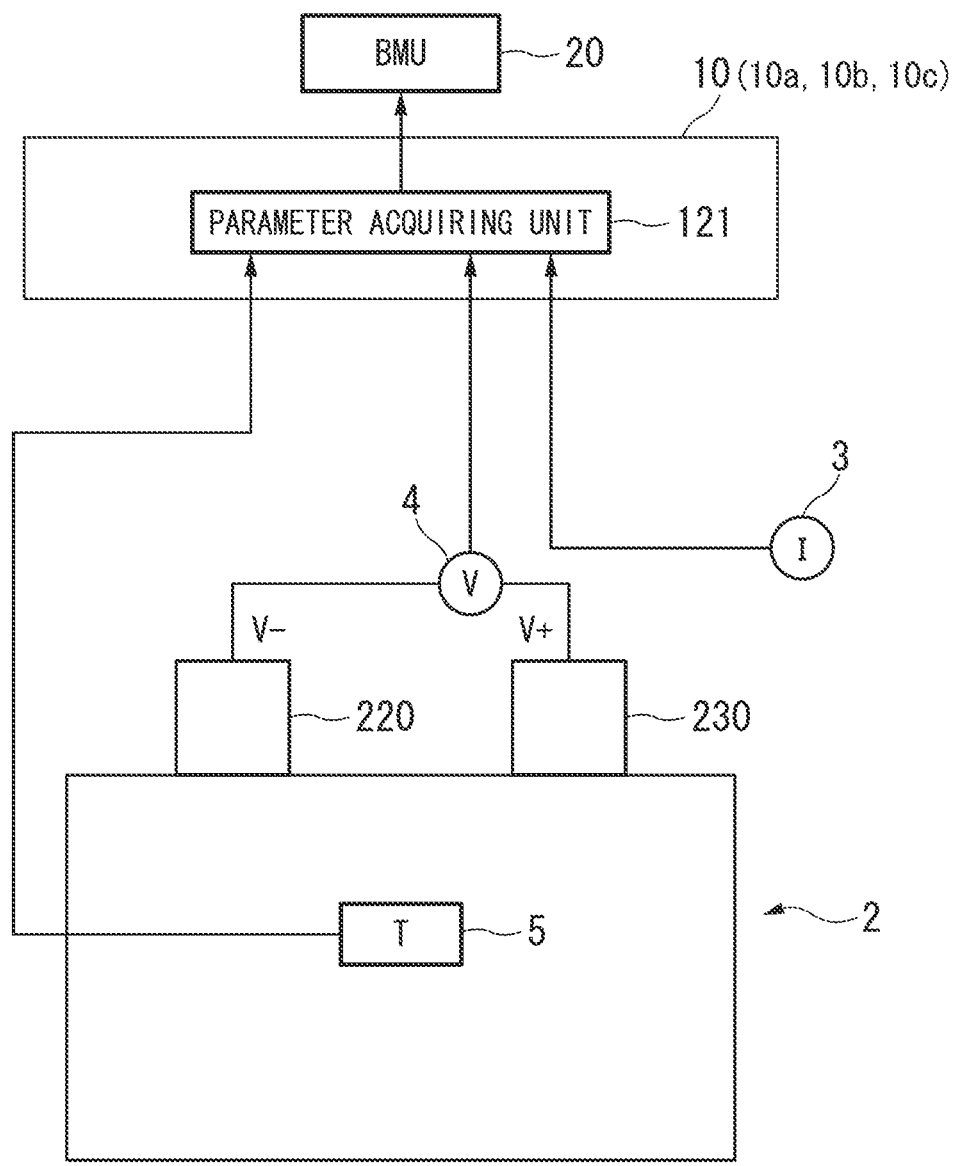
FIG. 2 is a diagram illustrating a connection example between a parameter measuring device and a CMU.

FIG. 2 is a diagram illustrating a connection example between a parameter measuring device such as an ammeter, a voltmeter, and a thermometer and the CMU 10.

In FIG. 2, the CMU 10 includes an ADC (Analog Digital Converter) (not shown) therein, and converts analogue signals of parameter values such as a current value of the battery module 30, a voltage value of each secondary battery 2, and a temperature value of each secondary battery 2 into digital signals by the ADC.

Further, the CMU 10 includes a parameter acquiring unit 121, and the parameter acquiring unit 121 converts the parameter values (the current value, the voltage value, and the temperature value) from the battery module 30 into digital signals and acquires the respective parameter values.

Furthermore, when the acquired parameter value of the CMU 10 is the voltage value, the parameter acquiring unit 121 of the CMU 10 acquires the voltage value of the secondary battery 2 through the voltmeter (V) 4 by connecting the voltmeter (V) 4 (the parameter measuring device) between a anode terminal 230 and a cathode terminal 220 of each secondary battery 2.

Further, when the acquired parameter value of the CMU 10 is the temperature, the parameter acquiring unit acquires data representing the temperature value of each secondary battery 2 which is measured by the thermometer (T) 5 by attaching the thermometer (T) 5 (the parameter measuring device) to a casing 200 of the secondary battery 2.

Further, when the acquired parameter value of the CMU 10 is the current value, the parameter acquiring unit 121 of the CMU 10 acquires the current value of the battery module 30 from the ammeter (I) 3 which is connected with secondary batteries 2 of the battery module 30 in series.

Then, the CMU 10 transmits each parameter value acquired from the secondary battery 2 to the BMU 20 through a signal line.

In the embodiment, the BMU 20 is connected to three CMUs 10 through signal lines. The BMU 20 has a function of managing each secondary battery 2 which is connected thereto through the CMU. For example, the BMU performs management relating to whether the voltage value of the secondary battery 2 is normal, performs a voltage adjustment (a cell balance) between the respective secondary batteries 2, and calculates the SOC (state of charge) of each secondary battery 2 on the basis of various information items of each secondary battery 2 transmitted from the CMU 10. Furthermore, the BMU 20 corresponds to the SOC calculating unit of the present invention.

Further, storage means such as a memory (not shown) of the BMU 20 stores an allowable current value reference table 6 shown in FIG. 4. Furthermore, in the embodiment, the output allowable current in the discharging operation is shown, but even the input allowable current during the charging operation may be used in this way. Further, the BMU 20 corresponds to the allowable current value reference table storage unit of the invention.

The allowable current value reference table 6 is a table which is used to calculate the allowable current value (unit: A) of the secondary battery 2 from the temperature of the secondary battery 2 (also referred to as a cell temperature) and the SOC (representing the value of the state of charge of the secondary battery 2) thereof. The respective allowable current values in the allowable current value reference table 6 are obtained in advance by experiment.

Furthermore, the allowable current value shown in FIG. 4 is an example, and various values may be used depending on the actual experiment or the condition. Further, the temperature indicated in the vertical axis is an example, which may be created as a table by the unit of 5° C. and may be appropriately set according to another usage range.

Then, as described below, the BMU 20 calculates a first allowable current value on the basis of the cell temperature of each secondary battery 2 constituting the battery unit and the SOC of the secondary battery 2. Here, various known methods may be applied at the time of calculating the SOC. For example, the SOC may be calculated on the basis of the accumulated value of the current detected by the ammeter 3 and may be calculated on the basis of the voltage value of the secondary battery 2.

Next, the process of the battery control system of the embodiment will be described according to the procedure.

Figure 3:
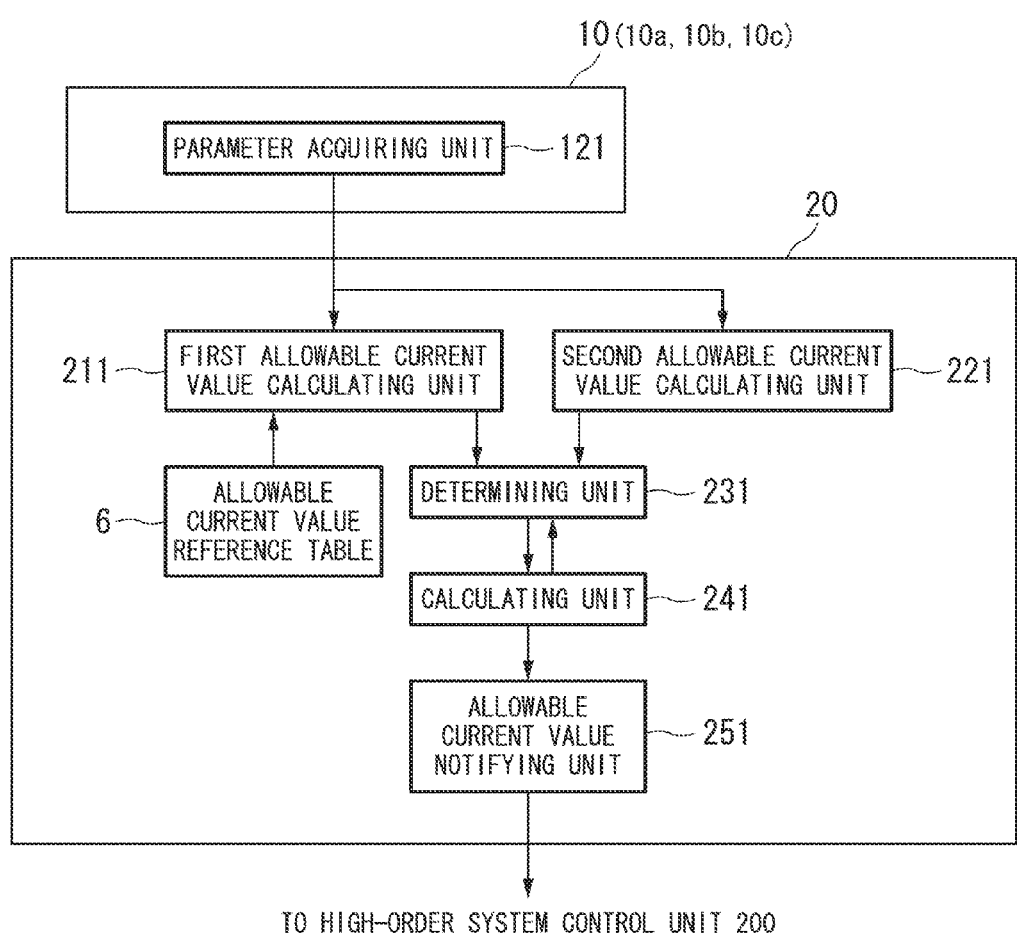
FIG. 3 is a diagram illustrating a functional block of the CMU and a BMU.

FIG. 3 is a diagram illustrating a functional block of the CMU and the BMU.

Figure 5:
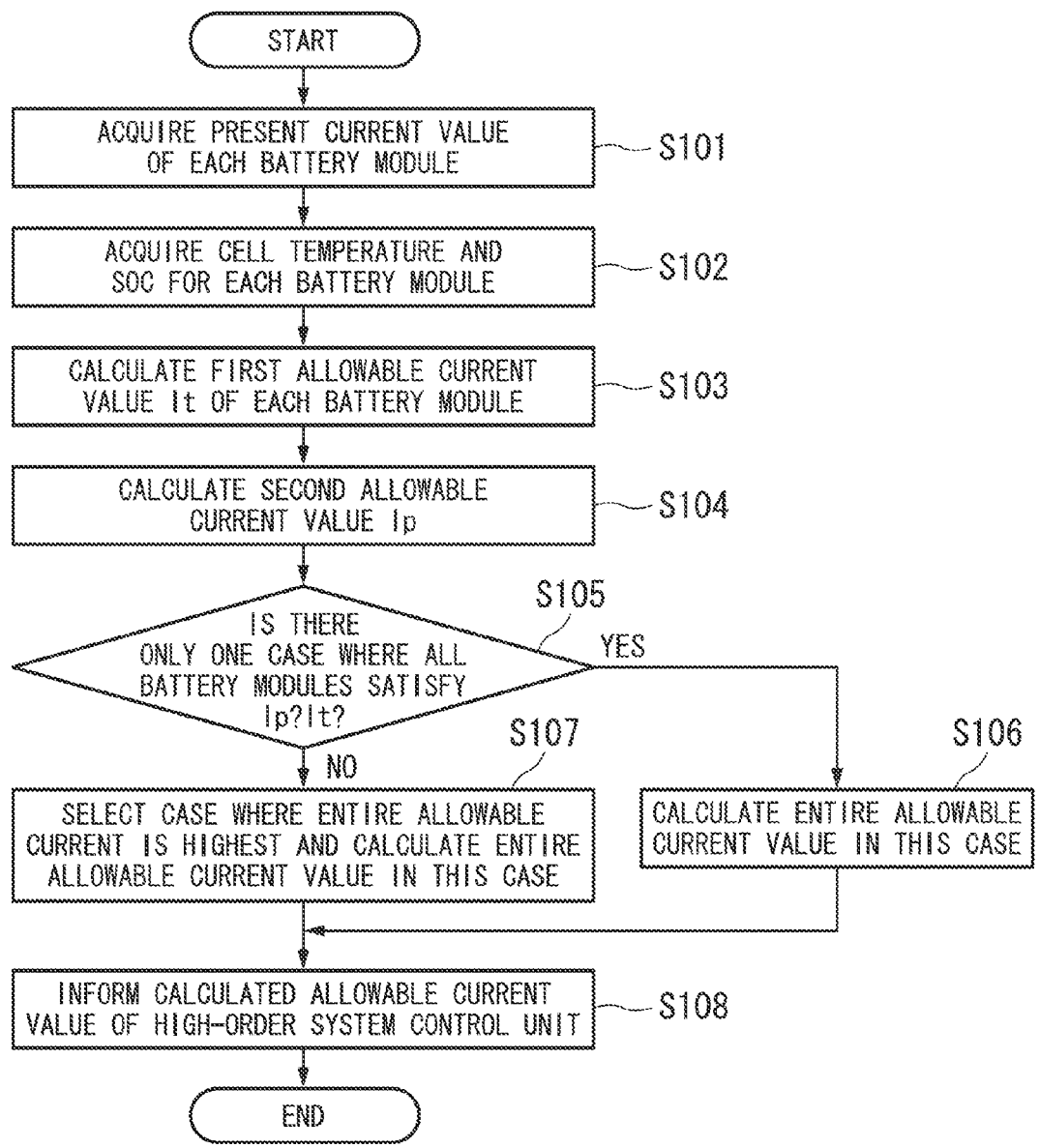
FIG. 5 is a diagram illustrating a process flow of a battery control system of an example.

FIG. 5 is a diagram illustrating a process flow of the battery control system.

Next, referring to FIGS. 3 and 5, the process flow of the battery control system 100 will be described according to the procedure thereof.

First, each parameter acquiring units 121 of the CMUs 10a to 10c of the BMS 1 acquires the value of charging and discharging current of each battery module 30 from the ammeters 3a to 3c (step S101). Furthermore, the value of charging and discharging current of the battery module 30a is referred to as Ia, the value of charging and discharging current of the battery module 30b is referred to as Ib, and the value of charging and discharging current of the battery module 30c is referred to as Ic.

The parameter acquiring unit 121 of the CMU 10 outputs the acquired current values Ia to Ic to the BMU 20.

Next, each parameter acquiring unit 121 of the CMUs 10a to 10c acquires the cell temperature from the thermometer 5 attached to each secondary battery 2 and outputs the value to the BMU 20. Then, the BMU 20 calculates the SOC for each secondary battery 2 according to the above-described known method (step S102).

Specifically, with regard to the cell temperature of the battery module 30a, for example, the CMU 10a acquires the temperature value from the thermometer 5a attached to the secondary battery 2a, and outputs the acquired temperature value as the cell temperature of the battery module 30a to the BMU 20. Further, with regard to the SOC of the battery module 30a, for example, the BMU 20 calculates the SOC from the accumulated value of the current of the secondary battery 2a of which the temperature value is acquired. Furthermore, the same applies to the secondary battery 2b.

In the same way, with regard to the cell temperature of the battery module 30b, for example, the CMU 10b acquires the temperature value from the thermometer 5c attached to the secondary battery 2c, and outputs the acquired temperature value as the cell temperature of the battery module 30b to the BMU 20. Further, with regard to the SOC of the battery module 30b, for example, the BMU 20 calculates the SOC from the accumulated value of the current of the secondary battery 2c of which the temperature value is acquired. Furthermore, the same applies to the secondary battery 2d.

Further, with regard to the cell temperature of the battery module 30c, for example, the CMU 10c acquires the temperature value from the thermometer 5e attached to the secondary battery 2e, and outputs the acquired temperature value as the cell temperature of the battery module 30c to the BMU 20. Then, with regard to the SOC of the battery module 30c, for example, the BMU 20 calculates the SOC from the accumulated value of the current of the secondary battery 2e of which the temperature value is acquired. Furthermore, the same applies to the secondary battery 2f.

Here, in many cases, the cell temperature and the SOC are different for each secondary battery 2. However, in the embodiment, for simplification of description, it is assumed that the cell temperatures and the SOCs for the respective secondary batteries 2 disposed inside any battery module 30 are substantially the same, and an example which calculates the cell temperature and the SOC for any one secondary battery 2 inside the battery module 30 will be described.

Furthermore, an example which calculates the cell temperature and the SOC inside the battery module 30 using another method will be described later.

Next, when the cell temperature and the SOC corresponding to each battery module 30 are acquired, a first allowable current value calculating unit 211 of the BMU 20 calculates the first allowable current value of each battery module 30 on the basis of the allowable current value reference table 6 shown in FIG. 4 (where the first allowable current values of the battery modules 30a to 30c are respectively defined as Ita, Itb, and Itc) (step S103). The respective first allowable current values which are calculated for the respective battery modules indicate the upper limit values of the current which may be charged to or discharged from the respective corresponding battery modules. For example, the upper limit values are set within the range where the respective battery modules may normally be operated.

Here, when the cell temperature of the battery module 30a acquired in step S102 is 20° C. and the SOC acquired therein is 30%, the first allowable current value of the battery module 30a is calculated as 15 A or the like on the basis of the allowable current value reference table 6.

Subsequently after the first allowable current value corresponding to each battery module 30 is calculated, a second allowable current value calculating unit 221 of the BMU 20 calculates a current value of each of the other battery modules 30 when a current of the first allowable current value is charged to or discharged from the reference battery modules 30a to 30c (the current value is set as the second allowable current value) (step S104).

Then, with regard to the second allowable current value, for example, the second allowable current values of the battery modules 30b and 30c are respectively defined as Ipab and Ipac when the battery module 30a is set as a reference. Further, the second allowable current values of the battery modules 30a and 30c are respectively defined as Ipba and Ipbc when the battery module 30b is set as a reference. Then, the second allowable current values of the battery modules 30a and 30b are respectively defined as Ipca and Ipcb when the battery module 30c is set as a reference.

In the embodiment, in step S103, each first allowable current value of each battery module 30 is calculated from the allowable current value reference table 6. However, this value is not obtained in consideration of uneven impedance between the respective battery modules 30. That is, each battery module 30 has original impedance due to differences in the wiring length or the contact resistance between the battery management unit and each battery module 30, and this impedance is not the same in general. However, this is not taken into consideration.

Thus, when the sum of the respective first allowable current values of the respective battery modules 30 is set as the allowable current value of the current output from the entire battery unit (that is, the output current of the battery pack), actually, there may be a battery module 30 which exceeds the allowable current value due to the above-described uneven impedance (which will be specifically described in the example below).

Therefore, in the embodiment, in step S104, the allowable current value is calculated again on the basis of the first allowable current value of each battery module 30 so that no battery module 30 exceeds the allowable current value.

More specifically, when it is assumed that there is no substantial change in the current distribution of each battery module 30 and the battery module 30a is used as a reference, the second allowable current values Ipab and Ipac have the following values.

$$Ipab = Ib \times Ita/Ia, \quad Ipac = Ic \times Ita/Ia$$

(In addition, the second allowable current value Ipaa of the battery module 30a becomes $Ipaa = Ia \times Ita/Ia$, and becomes equal to the first allowable current value Ita of the battery module 30a)

Further, in the same way, the second allowable current values when the battery module 30b is set as a reference and the battery module 30c is set as a reference are respectively as below.

$$Ipba=Ia \times Itb/Ib,\ Ipbc=Ic \times Itb/Ib,\ Ipbb=Itb$$

$$Ipca=Ia \times Itc/Ic,\ Ipcb=Ib \times Itc/Ic,\ Ipcb=Itc$$

Then, a determining unit 231 of the BMU 20 determines whether the calculated second allowable current value of each of the other battery modules 30 based on a certain reference battery module 30 exceeds the first allowable current value of the battery module 30 calculated in step S103 for every battery module 30, and determines whether one of combinations of the second allowable current values of the respective battery modules or a plurality of combinations satisfies this determination (step S105).

Specifically, for example, when the battery module 30a is set as a reference, the BMU 20 determines whether the following relationship is satisfied.

$$Ipab \le Itb\ \text{and}\ Ipac \le Itc$$

That is, this relationship is used to determine whether each of the battery module 30b and the battery module 30c exceeds the first allowable current value when a current corresponding to a current increase rate of the battery module 30a is charged to or discharged from the other battery modules 30b and 30c. At this time, the combination of the second allowable current value (which is referred to as Case 1) includes Ita, Ipab, and Ipac in order of the battery module 30a, the battery module 30b, and the battery module 30c. Since the first allowable current value of the battery module 30a is set as a reference, the second allowable current value of the battery module 30a is equal to the first allowable current value.

In the same way, the determination equation when the first allowable current value of the battery module 30b is set as a reference is expressed as below.

$$Ipba \le Ita\ \text{and}\ Ipbc \le Itc$$

At this time, the combination (which is referred to as Case 2) includes Ipba, Itb, and Ipbc in order of the battery module 30a, the battery module 30b, and the battery module 30c.

The determination equation when the first allowable current value of the battery module 30c is set as a reference is expressed as below.

$$Ipca \le Ita\ \text{and}\ Ipcb \le Itb$$

At this time, the combination (which is referred to as Case 3) includes Ipca, Ipcb, and Itc in order of the battery module 30a, the battery module 30b, and the battery module 30c.

Furthermore, in step S105, a determination is performed on the assumption that one or more pairs of combinations satisfying the above-described relationship are essentially present in Case 1 to Case 3. However, the assumption that one or more pairs of combinations satisfying the above-described relationship are essentially present may be proved mathematically. Accordingly, the determining unit 231 of the BMU 20 determines that at least one combination satisfies the above-described relationship.

Then, when there is one combination satisfying the above-described relationship in step S105, a calculating unit 241 of the BMU 20 calculates the allowable current value (Imax) of the current which is output from the entire battery unit of the combination, that is, the battery pack (step S106). Specifically, the allowable current value (Imax) is obtained by summing the respective second allowable current values of the combination satisfying the above-described relationship.

For example, when the combination based on the first allowable current value of the battery module 30a satisfies the above-described relationship in step S105, the allowable current value Imax of the entire battery unit is expressed by the following equation.

$$Imax=\{Ita+(Ib \times Ita/Ia)+(Ic \times Ita/Ia)\} \quad \text{[Equation 1]}$$

When the combination based on the first allowable current value of the battery module 30b satisfies the above-described relationship, the allowable current value Imax of the entire battery unit is expressed by the following equation.

$$Imax=\{(Ia \times Itb/Ib)+Itb+(Ic \times Itb/Ib)\} \quad \text{[Equation 2]}$$

When the combination based on the first allowable current value of the battery module 30c satisfies the above-described relationship, the allowable current value Imax of the entire battery unit is expressed by the following equation.

$$Imax=\{(Ia \times Itc/Ic)+(Ib \times Itc/Ic)+Itc\} \quad \text{[Equation 3]}$$

Then, when the combination based on the first allowable current value of the battery module 30a satisfies the above-described relationship in step S105, an allowable current value notifying unit 251 of the BMU 20 notifies the allowable current value Imax in the above-described combination as the allowable current value Imax of the entire battery unit to the high-order system control unit 200 (step S108).

On the other hand, when there are two pairs or more of combinations satisfying the above-described relationship in step S105, the determining unit 231 of the BMU 20 allows the calculating unit 241 to calculate the allowable current value (Imax) for each combination, and selects the combination in which the value is the largest.

Subsequently, the calculating unit 241 outputs the allowable current value Imax of the combination selected by the determining unit 231 to the allowable current value notifying unit (step S107).

For example, when the combination satisfying the above-described relationship is Case 2 and Case 3, the BMU 20 compares the respective values Imax, and notifies the larger value as the allowable current value Imax of the entire battery unit to the high-order system control unit 200. In this case, when the compared values Imax are equal to each other, the value is notified as the allowable current value Imax of the entire battery unit to the outside (in the embodiment, the high-order system control unit 200 of the electric vehicle).

Furthermore, in the embodiment, two values Imax of the battery module 30b and the battery module 30c are compared with each other, but the number may be three or more depending on the number of the battery modules 30 which are connected in parallel to each other. Even in this case, the determining unit 231 of the BMU 20 determines that the larger value is the allowable current value Imax of the entire battery unit.

Subsequently, an allowable current value notifying unit 251 of the BMU 20 notifies the allowable current value Imax calculated in step S106 or step S107 to the high-order system control unit 200 (step S108).

Furthermore, the BMU 20 repeats the process from step S101 to step S108 every predetermined period. Here, the predetermined period may be, for example, every second or every few minutes. Further, the interval of the above-described predetermined period may be shortened as the change rate of the current required in the power load 9 becomes larger.

When the high-order system control unit 200 which is mounted on the vehicle receives the allowable current value from the BMU 20, the high-order system control unit limits the current value which is required to the battery unit 50 by the power load 9 by setting the allowable current value as the upper limit.

Furthermore, the high-order system control unit 200 displays a message which sends a reminder to driver by controlling the display unit 300. As the message, a variety of content may be applied. However, for example, the fact that the present current supplied as power is close to the above-described allowable current value and the acceleration desired by the driver may not be obtained may be displayed or the fact that the remainder of the above-described allowable current value (for example, the remainder of 20% or the like) may be displayed.

As described above, according to the battery control system of the embodiment, a current which exceeds the allowable current is prevented from charging to or discharging from the plural battery modules constituting the battery unit. Accordingly, it is possible to prevent the output of the battery unit from being degraded or prevent from the degradation of the secondary battery constituting the battery module.

Modified Example 1

Furthermore, in the above-described embodiment, it is assumed that the cell temperature and the SOC are substantially the same with the battery module 30. However, the cell temperature and the SOC of the battery module 30 may be calculated by comparing the respective cell temperatures and the respective SOCs of the plural secondary batteries 2 constituting a certain battery module 30 with each other. Hereinafter, the modified example will be described.

As shown in FIG. 1, for example, the battery module 30*a* has a configuration in which two secondary batteries 2*a* and 2*b* are connected in series to each other. Therefore, in step S102, the BMU 20 acquires the cell temperatures Ta and Tb from the respective secondary batteries 2*a* and 2*b*, and calculates SOCa and SOCb of the respective secondary batteries 2*a* and 2*b* by the above-described method.

More specifically, with regard to the cell temperature of the secondary battery 2*a* constituting the battery module 30*a*, the CMU 10*a* acquires the cell temperature from the thermometer 5*a*. With regard to the cell temperature of the secondary battery 2*b*, the CMU 10*a* acquires the cell temperature from the thermometer 5*b*. Then, the acquired temperature values are output to the BMU 20.

Further, the CMU 10*b* and the CMU 10*c* also perform the same process as that of the CMU 10*a*, and respectively acquire the cell temperatures of the secondary batteries 2. Then, this temperature values are output to the BMU 20.

Subsequently, in step S103, with regard to the battery module 30*a*, the BMU 20 acquires the allowable current value of each of the secondary batteries 2*a* and 2*b* from the allowable current value table 6. Then, the BMU 20 determines the smaller value of two acquired allowable current values as the first allowable current value in the battery module 30*a*.

If the larger value is set as the first allowable current value, a current which exceeds the allowable current value flows to one of the secondary batteries 2*a* and 2*b* constituting the battery module 30*a*.

Then, even with regard to the battery module 30*b* and the battery module 30*c*, in the same way as described above, the BMU 20 detects the cell temperature of each of the secondary batteries 2*c* to 2*f* and calculates the SOC thereof, and determines the first allowable current value for each battery module 30.

In this way, according to the modified example 1, the first allowable current value is determined in a manner such that the cell temperature and the SOC for each secondary battery 2 constituting the battery module 30 are calculated and the allowable current values of the respective secondary batteries 2 are compared with each other.

Thus, the first allowable current value which is obtained for each battery module does not exceed the allowable current values of either secondary batteries constituting the battery module, and the first allowable current value for each battery module 30 may be calculated with higher accuracy.

Modified Example 2

In the above-described embodiment, an example has been described in which the high-order system control unit 200 which receives the allowable current value from the BMU 20 limits the current required by the power load 9 by the allowable current value, but the invention is not limited thereto.

For example, in a case where the battery control system is not an electric vehicle, but a hybrid vehicle on which an engine is also mounted, a control may be performed so that the difference between the current required by the power load 9 and the allowable current value, that is, the insufficient current amount is substantially compensated for by the power from the engine. Hereinafter, the modified example 2 will be described.

When the high-order system control unit 200 which is mounted on the hybrid vehicle receives the allowable current value from the BMU 20, the high-order system control unit stores the allowable current value in storage means such as a memory (not shown). On the other hand, the high-order system control unit 200 monitors the value of the current which is required by the power load 9, and frequently monitors whether the required current exceeds the allowable current value Imax transmitted from the BMU 20.

Then, for example, when the current required from the power load 9 increases due to the driver's accelerator operation and exceeds the allowable current value Imax transmitted from the BMU 20, the high-order system control unit 200 calculates the necessary power of the engine with respect to the difference.

Subsequently, the high-order system control unit 200 drives the engine by generating a control signal so that power corresponding to the insufficient current (the above-described difference) is obtained from the engine on the basis of the necessary power with respect to the above-described calculated difference.

In this way, according to the modified example 2, the insufficient power of the hybrid vehicle based on the allowable current value Imax transmitted from the BMU 20 may be compensated for by the engine. Further, the output of the battery unit may be prevented from being degraded or the lifespan of the secondary battery constituting the battery module may be prevented from being degraded.

Embodiments

Next, a specific embodiment of the invention will be described.

For example, the battery control system has a configuration shown in FIG. 1, and the values of the current which is discharged from the battery modules 30*a* to 30*c* at a certain time point are respectively set as 12 A, 8 A, and 4 A. In this case, first, the BMU 20 acquires the first allowable current value on the basis of the allowable current value reference table 6 from the values of the cell temperature and the SOC of each battery module 30 through the CMU 10.

With regard to the calculation of the first allowable current value, the cell temperatures and the SOCs of the secondary batteries 2 constituting the battery module 30 may be set to be substantially the same, and the first allowable current value may be determined by obtaining the cell temperature and the SOC for each secondary battery 2.

For example, the first allowable current values of the battery modules 30a to 30c are respectively set as 15 A, 14 A, and 16 A.

Next, the BMU 20 calculates the current values (the second allowable current values) of the other battery modules 30 when the first allowable current is charged to or discharged from the one battery module 30 corresponding to a reference.

Specifically, the second allowable current values in the cases where the respective battery modules 30 are respectively set as a reference are as shown below.

(Case 1) A current discharging from the other battery modules 30b and 30c, when the current of the first allowable current value is discharged from the battery module 30a.
Current flowing to battery module 30b: 8 A×15/12=10 A
Current flowing to battery module 30c: 4 A×15/12=5 A (Case 2) A current discharging from the other battery modules 30a and 30c, when the current of the first allowable current value is discharged from the battery module 30b.
Current flowing to battery module 30a: 12 A×14/8=21 A
Current flowing to battery module 30c: 4 A×14/8=7 A (Case 3) A current discharging from the other battery modules 30a and 30b, when the current of the first allowable current value is discharged from the battery module 30c.
Current flowing to battery module 30a: 12 A×16/4=48 A
Current flowing to battery module 30b: 8 A×16/4=32 A Subsequently, the BMU 20 determines whether there is one or more cases where each second allowable current value of all battery modules 30 does not exceed the corresponding first allowable current value, on the basis of the first allowable current value and the second allowable current value calculated as described above for every case. In Case 2, the second allowable current value of the battery module 30a exceeds the corresponding first allowable current value. Furthermore, in Case 3, since the respective second allowable current values of the battery module 30a and the battery module 30b exceed the corresponding first allowable current values, it is determined that only Case 1 corresponds to the allowable combination.

Subsequently, the BMU 20 calculates the allowable current value Imax in Case 1. Specifically, the sum (15 A+10 A+5 A=30 A) of the respective second allowable current values of the battery module 30a, the battery module 30b, and the battery module 30c is obtained, and the sum is transmitted as the allowable current value Imax of the battery pack to the high-order system control unit 200.

Then, the high-order system control unit 200 which receives the allowable current value Imax from the BMU 20 performs a control in which the current required in the power load 9 is limited by setting the allowable current value Imax (30 A) as the upper limit. That is, when the current value which exceeds the allowable current value Imax is required by the power load 9, the high-order system control unit 200 operates the power load 9 at the allowable current value Imax.

Furthermore, the CMU 10 or the BMU 20 in the above-described battery control system 100 includes a computer system therein. Then, the above-described process procedure may be stored in a storage medium which is readable as a program format, and when the program is read and run by the computer, the above-described process is performed.

Further, the CMU 10 may have a part of the process function of the BMU 20 (for example, a function of measuring the current value), and the BMU 20 may have a part of the process function of the CMU 10.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

INDUSTRIAL APPLICABILITY

It is possible to provide a battery pack capable of preventing occurrence of an abnormality in each battery module constituting a battery unit and hence preventing a value of charging and discharging current of each battery module from exceeding an allowable current value and a battery control system managing and controlling the battery pack.

REFERENCE SIGNS LIST

1: BMS
2: SECONDARY BATTERY
3: AMMETER
4: VOLTMETER
5: THERMOMETER
6: ALLOWABLE CURRENT VALUE REFERENCE TABLE
10: CMU
20: BMU
200: HIGH-ORDER SYSTEM CONTROL UNIT
300: DISPLAY UNIT

The invention claimed is:
1. A battery pack comprising:
a battery unit in which a plurality of battery modules with a plurality of secondary batteries connected in series to each other is connected in parallel to each other so that current is output to an external power load; and
a battery management unit that calculates an allowable current value of the current, wherein the battery management unit includes:
a first allowable current value calculating unit that calculates a first allowable current value of each of the plurality of battery modules on the basis of a cell temperature and a state of charge of each of the plurality of battery modules,
a second allowable current value calculating unit that calculates second allowable current values of the other battery modules on the basis of the first allowable current value of one battery module of the plurality of battery modules,
a calculating unit that calculates a value corresponding to the sum of the first allowable current value and the respective second allowable current values as an allowable current value when each of the second allowable current values is equal to or smaller than the first allowable current value of the corresponding battery module, and
an allowable electric power value notifying unit that notifies the value corresponding to the sum calculated by the calculating unit to the outside.

2. The battery pack according to claim 1,
wherein the battery management unit further includes
- a temperature value acquiring unit that acquires each temperature value of the plurality of secondary batteries,
- a state of charge calculating unit that calculates each state of charge of the plurality of secondary batteries,
- an allowable current value reference table storage unit that stores an allowable current value reference table in which the first allowable current values correlated to the temperature and the state of charge of the secondary batteries are stored, and
- a determining unit that determines whether each of the second allowable current values is equal to or smaller than the first allowable current value of the corresponding battery module, wherein the first allowable current value calculating unit calculates the first allowable current value for each battery module on the basis of the allowable current value reference table, the temperature value, and the state of charge, wherein the second allowable current value calculating unit calculates the second allowable current values of the each battery module based on the first allowable current values of the other battery modules on the basis of a current increase rate when a current of the first allowable current value is charged to or discharged from the one battery module used as the reference, wherein the determining unit determines whether each of the second allowable current values is equal to or smaller than the first allowable current value of the corresponding battery module for each combination of the plurality of battery modules based on each battery module, and wherein the calculating unit calculates a value corresponding to the second allowable current values of the respective battery modules in the combination satisfying the determination of the determining unit.

3. A battery control system comprising:
- a power load;
- a battery unit in which a plurality of battery modules with a plurality of secondary batteries connected in series to each other is connected in parallel to each other so that current is output to the power load;
- a first allowable current value calculating unit that calculates a first allowable current value of each of the plurality of battery modules on the basis of a cell temperature of and a state of charge of each of the plurality of battery modules;
- a second allowable current value calculating unit that calculates second allowable current values of the other battery modules on the basis of the first allowable current value of one battery module from the plurality of battery modules;
- a calculating unit that calculates a value corresponding to the sum of the first allowable current value and the respective second allowable current values as the allowable current value when each of the second allowable current values is equal to or smaller than the first allowable current value of the corresponding battery module; and
- a high-order system control unit that receives the allowable current value and controls the power load so that the power load is operated at a current equal to or smaller than the allowable current value.

4. The battery control system according to claim 3, further comprising:
- a vehicle wheel that is connected to the power load; and
- an engine that is connected to the vehicle wheel,
- wherein the high-order system control unit controls driving of the engine and performs a control in which a current corresponding to a difference between a required current value and the allowable current value is compensated by the driving of the engine when the required current value required by the power load is larger than the allowable current value.

* * * * *